(12) United States Patent
Watabe et al.

(10) Patent No.: US 10,396,304 B2
(45) Date of Patent: Aug. 27, 2019

(54) ORGANIC EL DISPLAY DEVICE AND LIQUID CRYSTAL DISPLAY DEVICE

(71) Applicant: Japan Display Inc., Tokyo (JP)

(72) Inventors: Kazufumi Watabe, Tokyo (JP); Yoshinori Ishii, Tokyo (JP)

(73) Assignee: Japan Display Inc., Tokyo (JP)

( * ) Notice: Subject to any disclaimer, the term of this patent is extended or adjusted under 35 U.S.C. 154(b) by 52 days.

(21) Appl. No.: 15/596,056

(22) Filed: May 16, 2017

(65) Prior Publication Data

US 2017/0338437 A1 Nov. 23, 2017

(30) Foreign Application Priority Data

May 23, 2016 (JP) .................................. 2016-102476

(51) Int. Cl.
| | | |
|---|---|---|
| *H01L 51/00* | (2006.01) | |
| *H01L 51/50* | (2006.01) | |
| *H01L 51/52* | (2006.01) | |
| *H05B 33/14* | (2006.01) | |
| *H05B 33/20* | (2006.01) | |
| *G06F 1/16* | (2006.01) | |
| *C09K 19/06* | (2006.01) | |
| *C09K 19/38* | (2006.01) | |
| *G02F 1/1333* | (2006.01) | |

(52) U.S. Cl.
CPC .......... *H01L 51/5036* (2013.01); *C09K 19/06* (2013.01); *C09K 19/38* (2013.01); *G06F 1/1652* (2013.01); *H01L 51/0076* (2013.01); *H01L 51/0097* (2013.01); *H01L 51/5246* (2013.01); *H01L 51/5253* (2013.01); *H01L 51/5293* (2013.01); *H05B 33/145* (2013.01); *H05B 33/20* (2013.01); *G02F 1/133305* (2013.01); *G02F 2201/54* (2013.01); *Y02E 10/549* (2013.01)

(58) Field of Classification Search
CPC ... H01L 51/0096–0097; H01L 51/5237–5256; H01L 2251/5338; H01L 51/5036; H01L 51/5262–5284; H01L 51/5293; G02F 1/133305; G02F 2001/133302
See application file for complete search history.

(56) References Cited

U.S. PATENT DOCUMENTS

| | | | | |
|---|---|---|---|---|
| 7,868,545 B2 * | 1/2011 | Hioki | ................ | G02F 1/133526 257/59 |
| 2003/0213956 A1 * | 11/2003 | Hioki | ................ | G02F 1/133305 257/59 |
| 2005/0274969 A1 * | 12/2005 | Suzuki | .............. | G02F 1/133526 257/98 |

(Continued)

*Primary Examiner* — Mariceli Santiago
(74) *Attorney, Agent, or Firm* — Michael Best & Friedrich LLP (57) ABSTRACT

The invention provides an organic EL display device that, even if bent, is not prone to plastic deformation and has improved moisture blocking characteristics.
An organic EL display device includes: a glass substrate; an organic EL layer formed on an upper side of the glass substrate; and a support substrate glued on a lower side of the glass substrate via a first adhesive. Recessed portions or projecting portions are formed on the glass substrate at a side thereof facing the support substrate. The recessed portions or a space between each of the projecting portions is filled with the first adhesive.

13 Claims, 11 Drawing Sheets

(56) References Cited

U.S. PATENT DOCUMENTS

| | | | |
|---|---|---|---|
| 2011/0108809 A1* | 5/2011 | Seo | H01L 51/524 |
| | | | 257/40 |
| 2014/0354558 A1 | 12/2014 | Cho et al. | |
| 2016/0118450 A1* | 4/2016 | Lee | H01L 51/001 |
| | | | 257/40 |
| 2018/0019418 A1* | 1/2018 | Sonoda | H01L 27/3276 |

* cited by examiner

ORGANIC EL DISPLAY DEVICE AND LIQUID CRYSTAL DISPLAY DEVICE

CLAIM OF PRIORITY

The present application claims priority from Japanese Patent Application JP 2016-102476 filed on May 23, 2016, the content of which is hereby incorporated by reference into this application.

BACKGROUND OF THE INVENTION

1. Field of the Invention

The present invention relates to display devices and particularly to a flexible display device with a bendable substrate.

2. Description of the Related Art

Organic electroluminescent (EL) display devices and liquid crystal display devices can be made thin enough to be bent flexibly. In such a case, the substrate on which various elements are to be formed is made of thin glass or thin resin.

Various wires and active elements are formed on the substrate. Although reducing the thickness of the substrate makes the display device bendable, bending the display device will impose stress on and may damage the wires and elements formed on the substrate.

In U.S. patent application No. 2014/0354558A1, the surfaces of the wires and elements formed on such a substrate are covered by another substrate with the use of an adhesive. By doing so, the compressive force imposed on the former substrate and the tensile stress imposed on the latter substrate are balanced so that the stress imposed on the wires and elements can be reduced.

SUMMARY OF THE INVENTION

To achieve a flexible display device, its substrate can be formed of resin such as a polyimide. The thickness of the resin can be reduced to 10 μm or thereabout. However, such a flexible display device has low rigidity, and inconvenience may be involved in handling the display device. Therefore, a support substrate is often attached to the outer side of the display device with the use of an adhesive. If the thickness of the support substrate is small enough, sufficient flexibility can still be maintained.

Such a flexible display device can be bent easily to an extent to have a small radius of curvature. However, the resin substrate is prone to plastic deformation and may not return to its original planar shape after being bent. Moreover, if displacement occurs at the interface between the resin substrate and the adhesive, detachment may occur with the resin substrate.

To achieve a flexible display device, a thin glass substrate can also be used. However, if such a display device is bent, similar problems will occur. That is, the glass substrate may be displaced relative to or detached from the resin substrate or resin sheet.

In the case of an organic EL display device, a resin substrate easily allows the passage of moisture therethrough, and the moisture that has passed through the resin substrate decomposes organic EL materials. This reduces the mechanical life span of the organic EL display device.

An object of the invention is to provide a flexible display device that is less prone to plastic deformation. Another object of the invention is to provide an organic EL display device with a long mechanical life span.

The invention is designed to achieve the above objects and can be implemented as the following devices.

(1) An organic EL display device including: a glass substrate; an organic EL layer formed on an upper side of the glass substrate; and a support substrate glued on a lower side of the glass substrate via a first adhesive, in which recessed portions or projecting portions are formed on the glass substrate at a side thereof facing the support substrate, and in which the recessed portions or a space between each of the projecting portions is filled with the first adhesive.

(2) An organic EL display device including: a glass substrate; a resin substrate formed on an upper side of the glass substrate; an organic EL layer formed on an upper side of the resin substrate; and a support substrate glued on a lower side of the glass substrate via a first adhesive, in which recessed portions or projecting portions are formed on the glass substrate at a side thereof facing the support substrate, and in which the recessed portions are filled with the first adhesive.

(3) A liquid crystal display device including: a first substrate formed of glass; a second substrate formed of glass; a liquid crystal layer sandwiched between the first substrate and the second substrate; a first polarizing plate glued on a lower side of the first substrate via a first adhesive; and a second polarizing plate glued on an upper side of the second substrate via a second adhesive, in which recessed portions or projecting portions are formed on the first substrate at a side thereof facing the first polarizing plate or on the second substrate at a side thereof facing the second polarizing plate, and in which the recessed portions or a space between each of the projecting portions is filled with the first adhesive or the second adhesive.

DESCRIPTION OF THE PREFERRED EMBODIMENTS

Embodiments of the present invention will now be described in detail.

Embodiment 1

Figure 1:
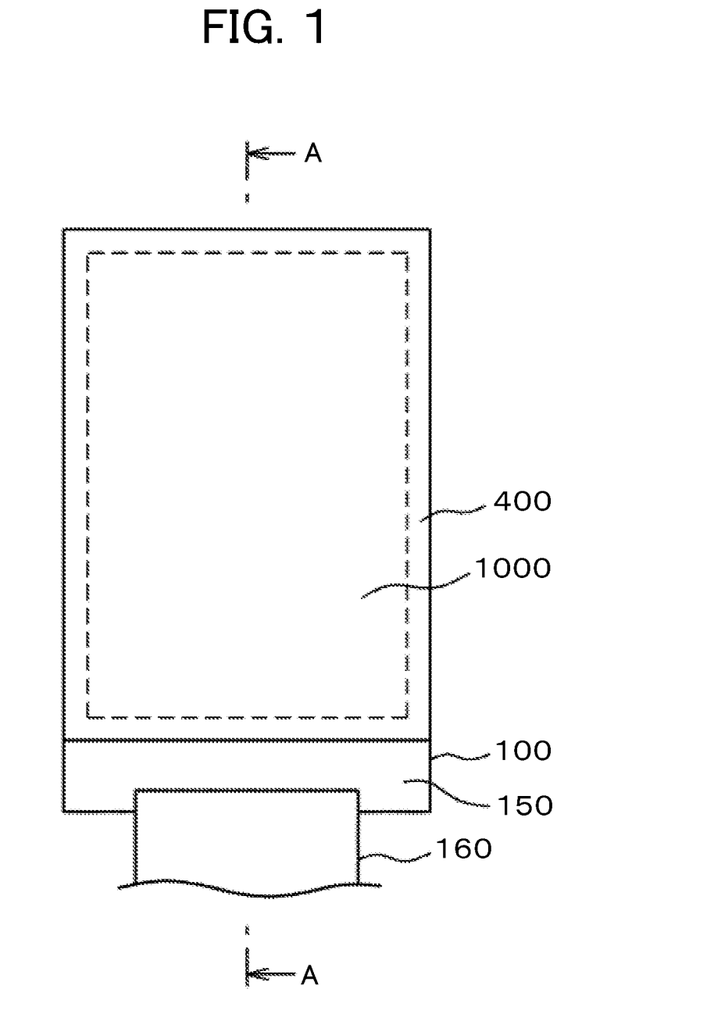
FIG. 1 is a plan view of a flexible display device.

FIG. 1 is a plan view of an organic EL display device to which the invention is applied. The organic EL display device of the invention can be bent flexibly. Because organic EL display devices do not require a backlight, they are advantageous as flexible display devices. As illustrated in FIG. 1, the organic EL display device includes a display area 1000 and a terminal section 150. An anti-reflective polarizing plate 400 is glued to cover the display area 1000. A flexible wiring substrate 160 is connected to the terminal section 150 so as to supply electric power and signals to the organic EL display device.

Figure 2:
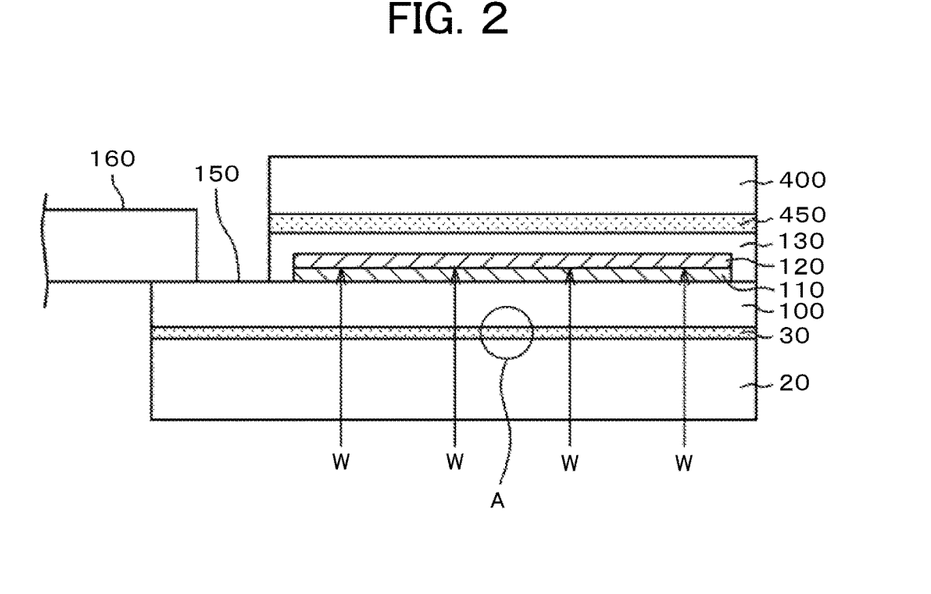
FIG. 2 is a cross section taken along line A-A of FIG. 1, presented as a comparative example.

FIG. 2 is a cross section taken along line A-A of FIG. 1, presented as a comparative example. As illustrated, an array layer 110 is formed on a resin substrate 100. The array layer 110 includes thin film transistors (TFTs), video signal lines, scan lines, power lines, and so forth. The resin substrate 100 is described as a polyimide substrate because polyimide substrates excel as substrates for flexible display devices. Note however that the substrate of the invention is not limited thereto.

Formed on the array layer 110 is an organic EL layer 120, which is located correspondingly to the display area 1000 of FIG. 1. The organic EL layer 120 shown in FIG. 2 is made up of a reflective electrode, a lower electrode, an organic EL material layer including a light-emitting layer, an upper electrode, and the like. Also, an undercoat, made of a silicon nitride (SiNx), a silicon oxide (SiOx), or the like, is formed between the polyimide substrate 100 and the array layer 110.

A protective layer 130, made of SiNx or the like, is formed to cover the organic EL layer 120. The protective layer 130 protects the organic EL layer 120 from external moisture or the like. The anti-reflective polarizing plate 400 is glued to the protective layer 130 by an adhesive 450 so as to cover the layer 130. The organic EL display device of FIG. 2 is of the top emission type. Because a top-emission type display device includes reflective electrodes, its screen will reflect external light, which makes the screen less clear. The polarizing plate 400 is thus provided to prevent such reflection of external light. The polarizing plate 400 is also made of resin; thus, it can be called a resin sheet.

The section of the polyimide substrate 100 on which the array layer 110 and the organic EL layer 120 are not formed is used as the terminal section 150. The wiring from the array layer 110 is connected to terminals at the terminal section 150. The flexible wiring substrate 160, which supplies electric power and signals, is also connected to the terminals. The connection of the flexible wiring substrate 160 to the terminals is done by, for example, thermo compression bonding.

The polyimide substrate 100 shown in FIG. 2 is about 10 to 20 μm thick, which means that inconvenience may be involved in handling the substrate 100 or that the substrate 100 is not mechanically robust. Therefore, a support substrate 20, made of PET (polyethylene terephthalate), acrylic resin, or the like, is glued to the polyimide substrate 100 via an adhesive 30.

Since the polyimide substrate 100 is thin (about 10 μm thick), it is likely to allow the passage of external moisture therethrough. The reference numeral 'W' in FIG. 2 denotes moisture. As already stated, an undercoat, made of SiNx, SiOx, and the like, is formed between the polyimide substrate 100 and the array layer 110. However, the undercoat does not provide sufficient blocking of moisture flow. Thus, the organic EL display device of FIG. 2 does not have a sufficient mechanical life span.

Figure 3:
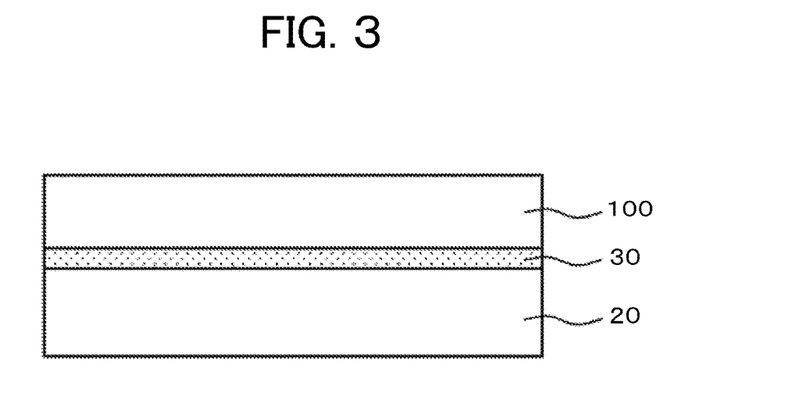
FIG. 3 is an enlarged view of section A of FIG. 2.

On the other hand, bending the organic EL display device of FIG. 2 generates a stress between the support substrate 20 and the polyimide substrate 100. Because the support substrate 20 is formed relatively thick (0.1 mm or higher), different stresses are likely to be imposed on the support substrate 20, the polyimide substrate 100, and the layers above the polyimide substrate 100. FIG. 3 is an enlarged view of the section A of FIG. 2. As illustrated in FIG. 3, the support substrate 20 is glued to the polyimide substrate 100 via the adhesive 30.

Figure 4:
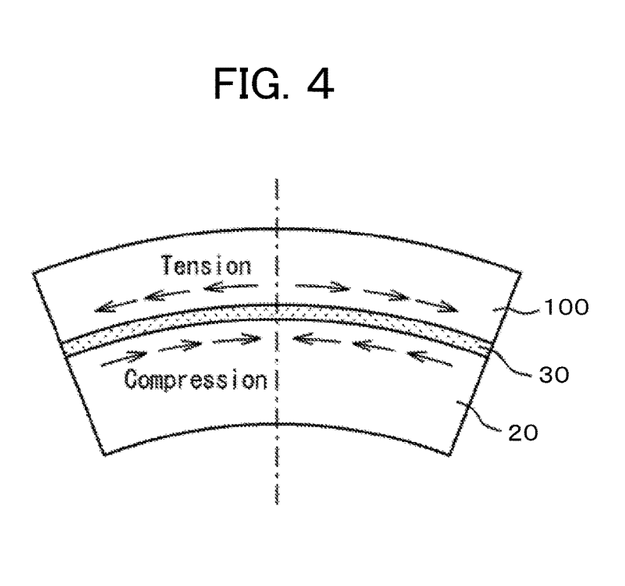
FIG. 4 is a schematic cross section illustrating the organic EL display device of FIG. 2 when bent.

FIG. 4 is a cross section illustrating how stress is imposed when the two substrates 100 and 20 are bent. As illustrated in FIG. 4, a tensile stress is imposed on the polyimide substrate 100 above the adhesive 30 while a compressive stress is imposed on the support substrate 20 below the adhesive 30. If the two substrates 100 and 20 are displaced relative to the adhesive 30 due to the stresses, the flexible display device does not return to its original shape after the bending. In other words, the flexible display device undergoes plastic deformation, or either of the two substrates is detached partially.

Figure 5:
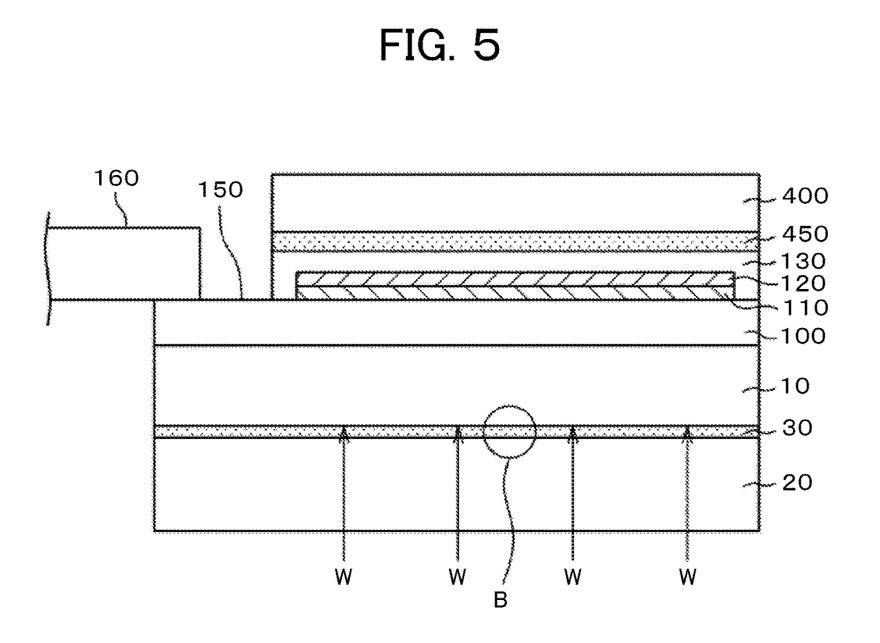
FIG. 5 is a cross section of an organic EL display device according to Embodiment 1 of the invention.

FIG. 5 is a cross section of an organic EL display device according to the invention, which is designed to solve the above problems. FIG. 5 differs from FIG. 2 in that, in the former, a glass substrate 10 is disposed between the support substrate 20 and the polyimide substrate 100. The glass substrate 10 is abraded to have a small thickness. The thickness of the glass substrate 10 is equal to or less than 0.2 mm, or may be equal to or less than 0.1 mm. If the radius of curvature can be relatively large, the thickness can be 0.3 mm or thereabout.

Figure 6:
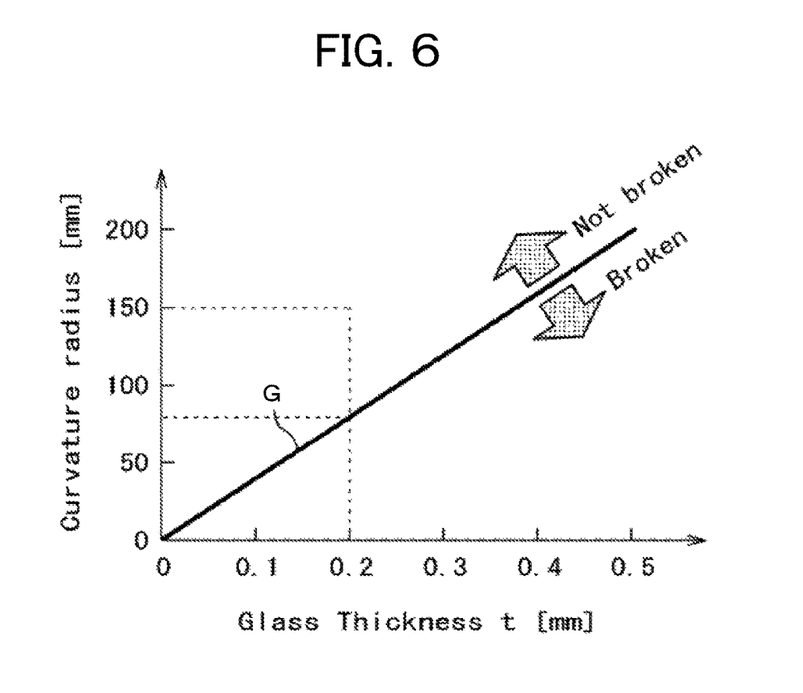
FIG. 6 is a graph illustrating the relation between the thickness of glass and the radius of curvature when the glass is bent.

When glass is made thin, it gets flexible and can be bent easily. FIG. 6 is a graph illustrating the relation between glass thickness and the radius of curvature that allows for bending. As illustrated in FIG. 6, glass will not be broken if the radius of curvature is greater than the values of line G. When glass has a thickness of, for example, 0.2 mm, it can be bent to an extent to have a curvature radius of about 75 mm. If the radius of curvature is 150 mm or thereabout, there is a sufficient margin for bending the glass.

Therefore, the organic EL display device of FIG. 5 can be used satisfactorily as a flexible display device. The organic EL display device of FIG. 5 is fabricated in the following manner.

A polyimide material such as a polyamide acid is applied on the glass substrate 10 with the use of a slot die coater and then baked, resulting in formation of the polyimide substrate 100 having a thickness of 10 to 20 μm. The array layer 110, the organic EL layer 120, the protective layer 130, and the like are then formed on the polyimide substrate 100. At first, the thickness of the glass substrate 10 is approximately 0.5 mm because the glass substrate 10 needs to have a certain extent of rigidity for the fabricating processes.

After the protective layer 130 has been formed to protect the organic EL layer 120, the glass substrate 10 is abraded to a thickness of, for example, 0.2 mm, thereby making the organic EL display device flexibly bendable. Because producing organic EL display devices one by one is inefficient, many of them are formed on a mother substrate. The mother substrate is subjected to various fabricating steps, the last one of which is the abrasion step. Thereafter, each of the organic EL display devices is separated from the mother substrate by laser cutting or the like. A support substrate 20 is then glued to each of the separated organic EL display devices.

A first feature of the organic EL display device of the invention is that, as illustrated in FIG. 5, the glass substrate 10 blocks the flow of moisture W, thus preventing it from reaching the organic EL layer 120. Therefore, the invention prevents the deterioration of the organic EL layer 120 due to the moisture W and extends the life span of the organic EL display device.

Figure 7:
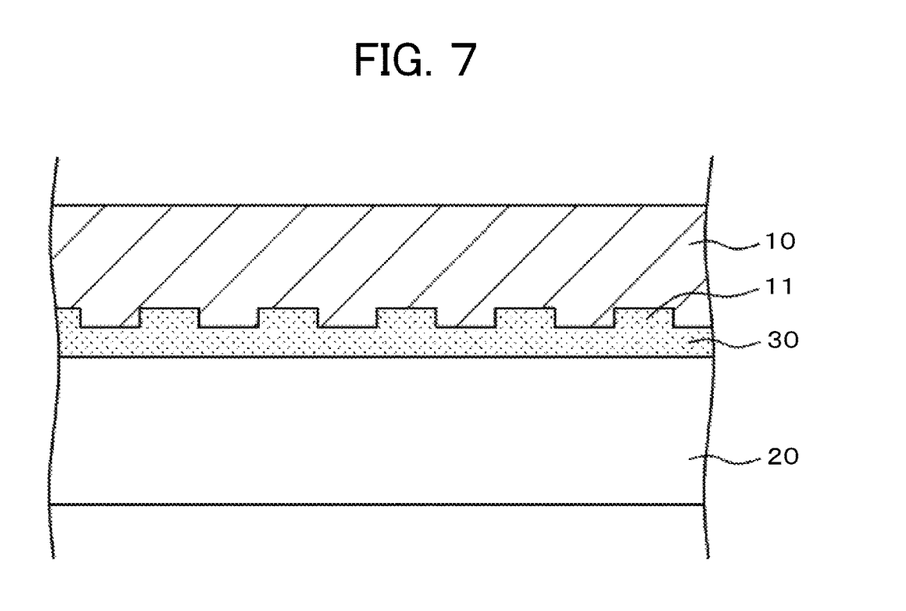
FIG. 7 is an enlarged view of section B of FIG. 5.

Another feature of the invention is that recessed portions 11 are formed on the glass substrate 10 at a side thereof to be glued to the support substrate 20 and that, by filling the recessed portions 11 with the adhesive 30, they are made to act as anchors. FIG. 7 is an enlarged view of the section B of FIG. 5. As illustrated in FIG. 7, the recessed portions 11 are formed at intervals on the glass substrate 10 and filled with the adhesive 30. The anchoring effect of the adhesive 30 put into the recessed portions 11 prevents displacement of the glass substrate 10 and the support substrate 20.

Figure 8:
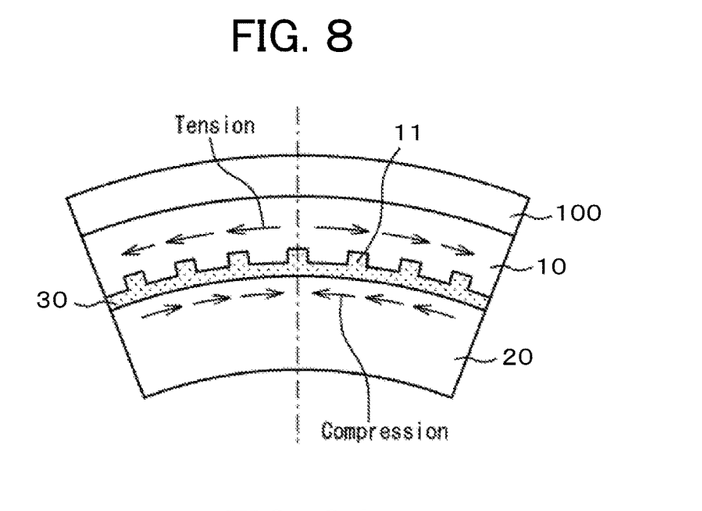
FIG. 8 is a schematic cross section illustrating the organic EL display device of FIG. 5 when bent.

FIG. 8 is a cross section illustrating the above effect. In FIG. 8, the polyimide substrate 100 is formed on the glass substrate 10. Although not illustrated, the array layer, the organic EL layer, and so forth are formed on the polyimide substrate 100. In FIG. 8, when the organic EL display device is bent, the largest stress is generated between the glass substrate 10 and the support substrate 20, which are relatively thick layers.

Specifically, a tensile stress is imposed on the glass substrate 10 while a compressive stress is imposed on the support substrate 20. The adhesive 30 and the interface between the two substrates are exposed to those stresses. As illustrated in FIG. 8, the recessed portions 11 are formed on the glass substrate 10, and the adhesive 30 put into the recessed portions 11 acts as an anchor, thereby preventing displacement of the glass substrate 10. Because the adhesive 30 is applied to the support substrate 20, the adhesive force at the interface between the support substrate 20 and the adhesive 30 is strong. Thus, by forming the recessed portions 11 on the glass substrate 10, the glass substrate 10 and the support substrate 20 can be prevented from being displaced or detached when they are bent.

Still another feature of the structure of FIG. 5 is that the presence of the glass substrate 10 between the polyimide substrate 100 and the support substrate 20 makes the entire organic EL display device less prone to plastic deformation. This is because the glass is hardly prone to plastic deformation. In other words, while the recessed portions 11 formed on the glass substrate 10 prevent displacement of the glass substrate 10 and the support substrate 20, this also means that the organic EL display device of the invention is hardly prone to plastic deformation.

Figure 9A:
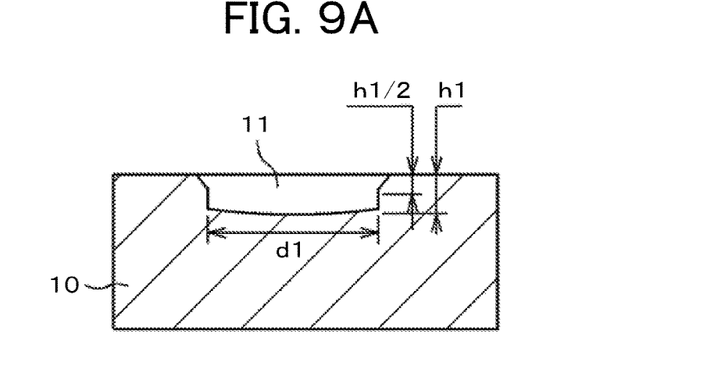
FIG. 9A illustrates an example of the cross-sectional shape of a recessed portion.

FIG. 9A is a cross section of one of the recessed portions formed on the glass substrate 10. In FIG. 9A, h1 represents the depth of the recessed portion 11 while d1 represents its diameter. The diameter d1 is measured at the depth of h1/2. If the recessed portion 11 is not circular in plan view, the diameter d1 represents the largest width. The depth h1 is, for example, 0.01 mm, the diameter d1 being 0.3 mm, the pitch p1 of the recessed portion 11 being 0.6 mm. If the thickness of the glass substrate 10 is assumed to be t, the depth h1 of the recessed portion 11 is such that $0.001 \leq h1/t \leq 0.1$ or preferably such that $0.001 \leq h1/t \leq 0.05$.

The recessed portions 11 can be formed by, for example, etching with the use of hydrogen fluoride, laser machining, or mechanical dimple machining. In the case of laser machining, colored glass can be used to effectively absorb energy. Mechanical dimple machining can be performed by, for example, pressing many V-shaped projections onto the glass surface. The dimple machining is followed by re-abrasion.

Figure 9B:
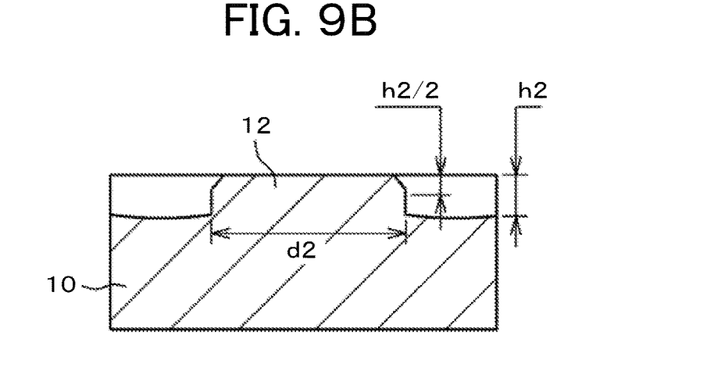
FIG. 9B illustrates an example of the cross-sectional shape of a projecting portion.

FIG. 9B illustrates one of projecting portions 12 formed on the glass substrate 10 in contrast to FIG. 9A in which one of the recessed portions 11 is formed. When the adhesive 30 flows into the recessed portions that have been formed as the result of the formation of the projecting portions 12, the anchoring effect will be produced. As illustrated in FIG. 9B, the height h2 of the projecting portion 12 is measured from the bottom of a recessed portion. The diameter of the projecting portion 12 is presented by d2 and measured at the height of h2/2 from the top of the projecting portion 12. If the projecting portion 12 is not circular in plan view, the diameter d2 represents the largest width. The height h2 is, for example, 0.01 mm, the diameter d2 being 0.3 mm, the pitch of the projecting portion 12 being 0.6 mm.

If the thickness of the glass substrate 10 is assumed to be t, the height h2 of the projecting portion 12 is such that $0.001 \leq h2/t \leq 0.1$ or preferably such that $0.001 \leq h2/t \leq 0.05$. The projecting portions 12 can be formed by, for example, etching with the use of hydrogen fluoride or laser machining. In the case of laser machining, colored glass can be used to effectively absorb energy. Since the recessed portions 11 and the projecting portions 12 produce the same effect, the following explanation is based on the assumption that the recessed portions 11 are formed on the glass substrate 10.

Figure 10:
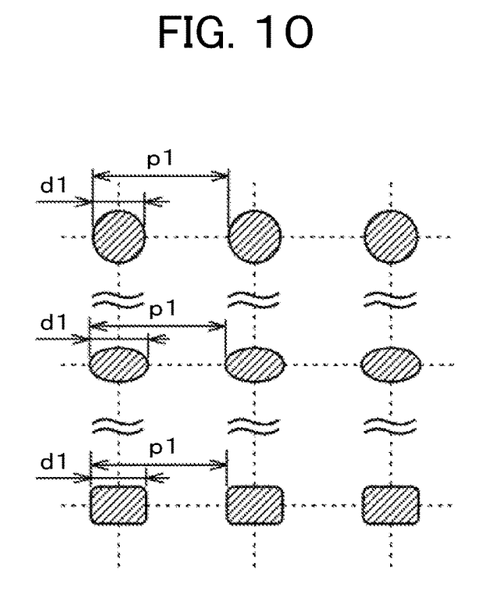
FIG. 10 is a plan view illustrating various planer shapes of recessed portions.

FIG. 10 is a plan view of the recessed portions 11. In FIG. 10, the upper three recessed portions 11 illustrate ones that are circular in plan view, the middle three illustrating ones that are elliptical in plan view, the lower three illustrating ones that are rectangular in plan view. The diameter d1 and pitch p1 of the recessed portions 11 are defined in such a manner as illustrated in FIG. 10. It should be noted that the recessed portions 11 can instead take the form of continuous linear recessed portions that run in a particular direction.

Figure 11:
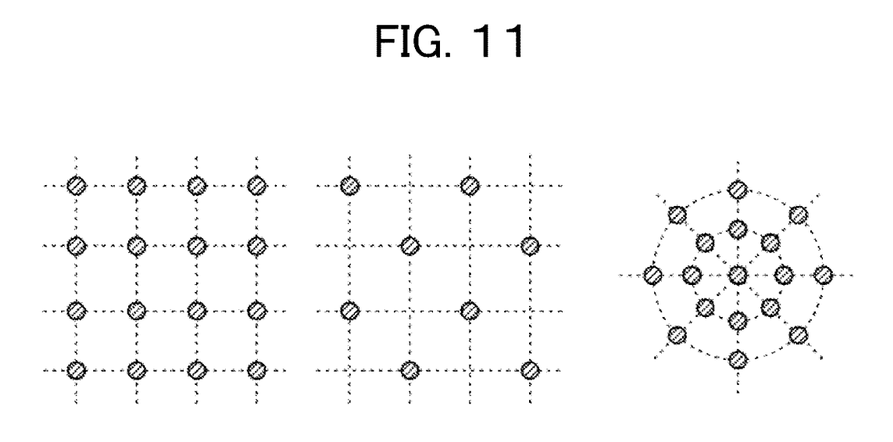
FIG. 11 illustrates layout examples of recessed portions.

FIG. 11 illustrates layout examples of the recessed portions 11. The left figure of FIG. 11 illustrates a grid-like layout while the middle one illustrates a checkered layout. Also, the right one illustrates a radial layout. The layout of the recessed portions 11 can take various forms depending on the predictable bending directions of the flexible display device.

Figure 12:
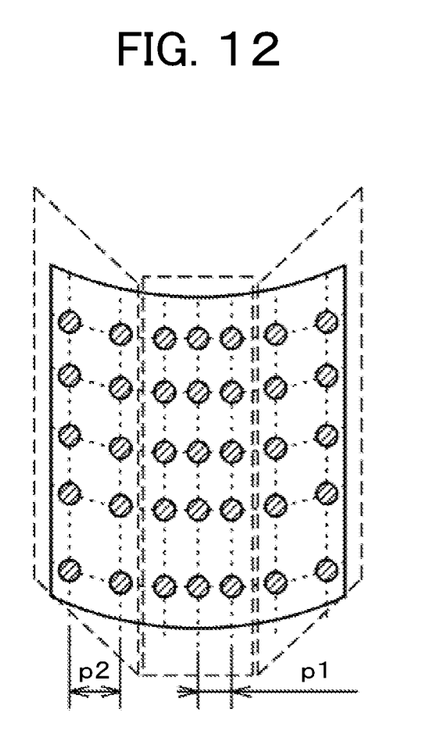
FIG. 12 illustrates an example of how the density of recessed portions can be distributed.

FIG. 12 illustrates an example in which the density of the recessed portions 11 is changed based on their locations. When the flexible display device is bent, the greatest stress will occur at the originating point of the bending, that is, at the center of the bending. In FIG. 12, the density of the recessed portions 11 is increased near the center of the bending, whereby displacement of the glass substrate 10 and the support substrate 20 is prevented effectively near the center of the bending. Specifically, if the pitch of the recessed portions 11 located near the center of the bending is assumed to be p1 and that of the rest of the recessed portions 11 is assumed to be p2, the pitch p1 and the pitch p2 are set such that p2>p1.

As stated above, in the invention, the glass substrate 10 is disposed between the polyimide substrate 100 and the support substrate 20, and the recessed portions 11 are formed on the glass substrate 10 at a section facing the support substrate 20 via the adhesive 30. Therefore, it is possible to prevent plastic deformation of the organic EL display device and detachment of the glass substrate 10 and the support substrate 20. It is also possible to prevent, with the use of the glass substrate 10, entry of moisture into the organic EL layer.

Embodiment 2

Organic EL display devices can be divided into two types: those in which organic EL materials are used such that the organic EL layer emits lights of different colors for the pixels; and those in which the organic EL layer emits white light and a color filter is used to produce colored images. When the color filter is used, the counter substrate on which the color filter is formed is disposed above the organic EL layer.

Figure 13:
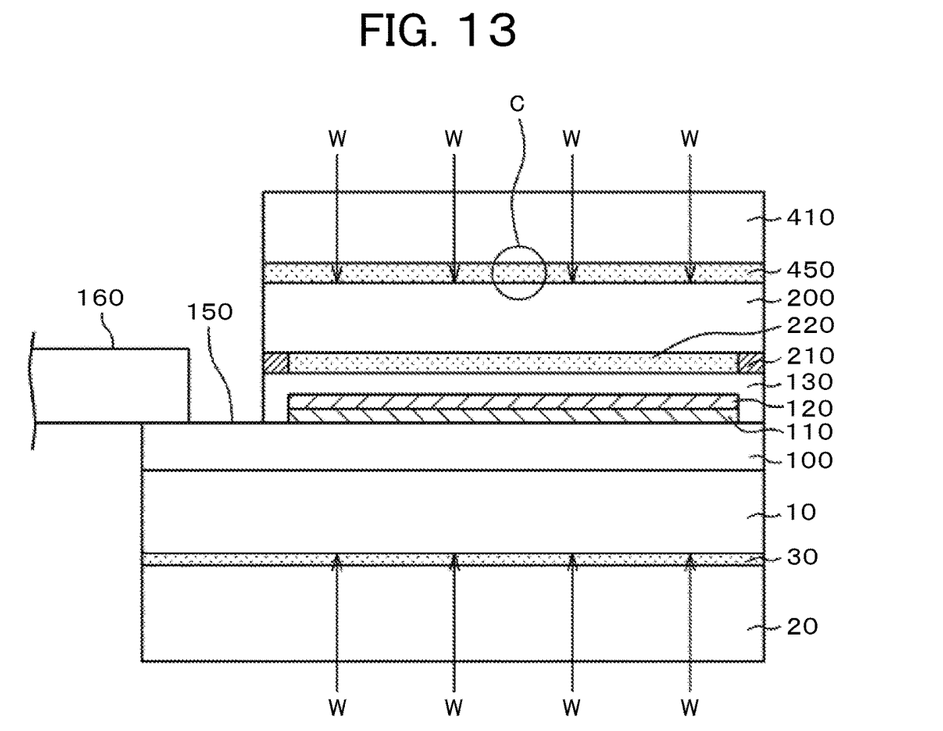
FIG. 13 is a cross section according to Embodiment 2 of the invention.

FIG. 13 illustrates an example of such a case. FIG. 13 is the same as FIG. 5 related to Embodiment 1 in terms of the fabricating steps up to the formation of the protective layer 130 to cover the organic EL layer 120. As illustrated in FIG. 13, in order to glue a counter substrate 200 to the protective layer 130, a sealing material 210 is formed on the peripheral region of the protective layer 130, and a UV-curable resin 220 is applied as an adhesive to the internal region within the peripheral region. The sealing material 210 is used to prevent the UV-curable resin 220, which is in the form of liquid, from flowing outward. The sealing material 210 is formed by applying an epoxy resin or acrylic resin and then curing it.

Thereafter, the counter substrate 200 on which a color filter is formed is glued such that the surface on which the color filter is formed faces the organic EL layer 120. The UV-curable resin 220 is then irradiated with ultraviolet rays to glue the counter substrate 200 to the protective layer 130, which is located on the polyimide substrate side. Thereafter, an anti-reflective polarizing plate 400 is glued to the counter substrate 200 via an adhesive 450.

When the organic EL display device thus formed is bent, the counter substrate 200 and the polarizing plate 400 may be displaced relative to each other due to different stresses imposed on the glass-made counter substrate 200 and the polarizing plate 400. Alternatively, the counter substrate 200 and the polarizing plate 400 may be detached from each other.

Figure 14:
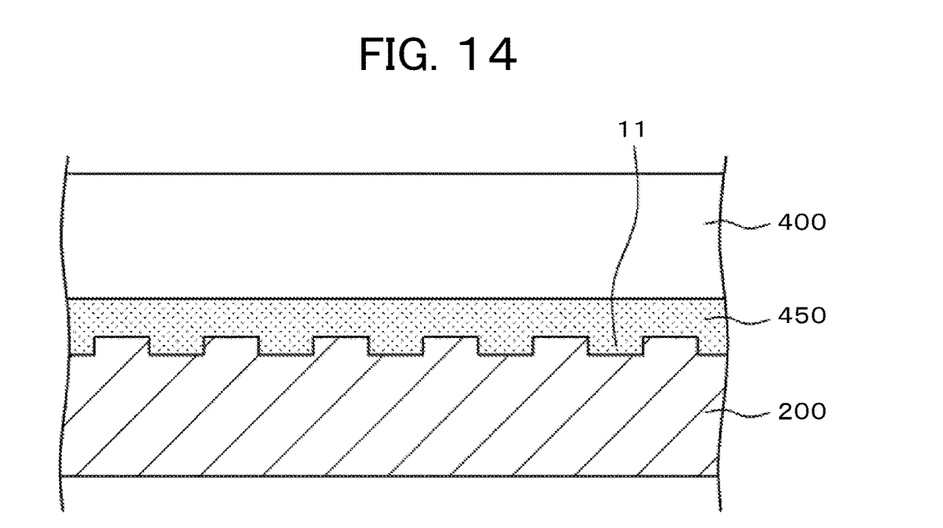
FIG. 14 is an enlarged view of section C of FIG. 13.

Therefore, in Embodiment 2 of the invention, the recessed portions 11 are formed at intervals on the counter substrate 200 at a side thereof facing the polarizing plate 400 as illustrated in FIG. 14, thereby preventing displacement of the counter substrate 200 and the polarizing plate 400. As illustrated in FIG. 14, the recessed portions 11 are formed on the counter substrate 200 and filled with the adhesive 450, and the anchoring effect is thus produced. As a result, displacement or detachment of the counter substrate 200 and the polarizing plate 400 can be prevented.

The cross-sectional shape of the recessed portions 11 formed on the counter substrate 200 is the same as that illustrated in FIG. 9. In terms of their planar shape, layout, and density, the same explanation applies as in FIGS. 10, 11 and 12, respectively.

It should be noted that if light passing through the counter substrate 200 is scattered, the image being produced may be less clear. Thus, the counter substrate 200 and the adhesive 450 need to have a similar refractive index.

Another feature of Embodiment 2 is that, as illustrated in FIG. 13, the glass-made counter substrate 200 blocks the flow of the moisture W that comes from above the organic EL layer. Therefore, Embodiment 2 is capable of further extending the life span of the organic EL display device further. Also, while we have stated that a color filter is formed on the counter substrate 200 of FIG. 13, the color filter is not necessarily required. In other words, the glass-made counter substrate 200 is also used for an organic EL display device in which the organic EL layer emits lights of different colors for the pixels. In that case as well, the same advantageous effects can be obtained.

Embodiment 3

Figure 15:
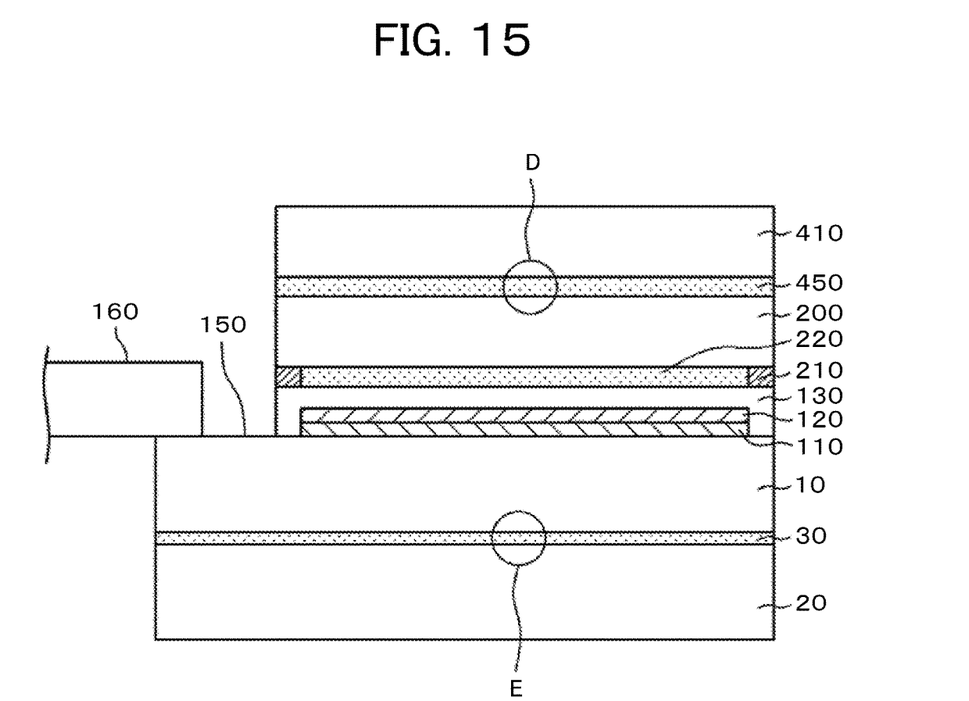
FIG. 15 is a cross section according to Embodiment 3 of the invention.

In Embodiments 1 and 2, the array layer 110 and the organic EL layer 120 are formed on the polyimide substrate 100. By contrast, in Embodiment 3 of the invention, the array layer 110 and the organic EL layer 120 are directly formed on the glass substrate 10 without using the polyimide substrate 100. FIG. 15 is a cross section according to Embodiment 3.

As illustrated in FIG. 15, the array layer 110 and the organic EL layer 120 are formed on the glass substrate 10. The other components are the same as those of FIG. 13 related to Embodiment 2. The section D of FIG. 15, which illustrates the adhesion between the counter substrate 200 and an upper polarizing plate 410, is the same as FIG. 14 related to Embodiment 2. Also, the section E of FIG. 15, which illustrates the adhesion between the glass substrate 10 and the support substrate 20, is the same as FIG. 7 related to Embodiment 1.

If light passing through the counter substrate 200 is scattered, the image being produced may be less clear. Thus, the counter substrate 200 and the adhesive 450 need to have a similar refractive index.

In Embodiment 3, the same effects as those mentioned in Embodiment 2 can be obtained, that is, prevention of plastic deformation and substrate displacement when the flexible display device is bent. Embodiment 3 also produces the same moisture blocking effect by using a glass substrate as in Embodiment 2.

FIG. 15 illustrates an example in which the counter substrate 200 is disposed on the protective layer 130. If, on the other hand, the glass-made counter substrate 200 is not present on the protective layer 130 as in FIG. 5 related to Embodiment 1, the same effects as those of Embodiment 1 can be obtained.

Embodiment 4

Figure 16:
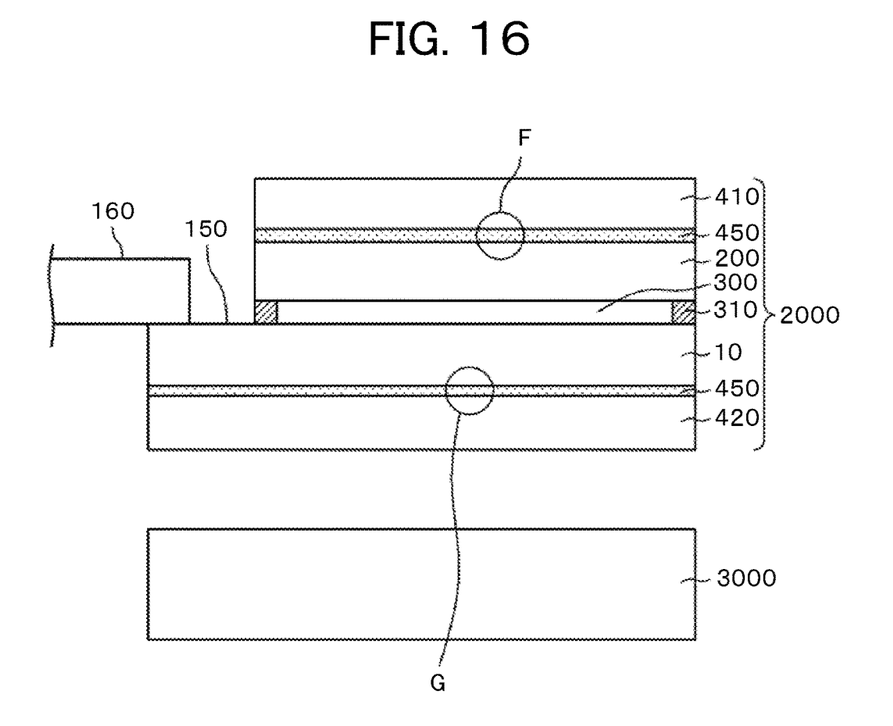
FIG. 16 is a cross section according to Embodiment 4 of the invention.

In Embodiments 1 to 3, the invention is applied to organic EL display devices. However, the invention can also be applied to liquid crystal display devices. FIG. 16 illustrates an example in which the invention is applied to a liquid crystal display device. As illustrated in FIG. 16, a liquid crystal layer 300 is sandwiched between the glass substrate 10 and the counter substrate 200. The liquid crystal layer 300 is sealed with a sealing material 310. Formed on the glass substrate 10 are scan lines, video signal lines, TFTs that act as switching elements, pixel electrodes, a common electrode, and so forth. The components formed on the counter substrate 200 include, for example, a color filter and a black matrix.

The section of the glass substrate 10 above which the counter substrate 200 is not present acts as the terminal section 150. The flexible wiring substrate 160 is connected to the terminal section 150 to supply electric power and signals to the liquid crystal display device. In FIG. 16, the glass substrate 10 is abraded to a thickness of 0.2 mm or less. Likewise, the counter substrate 200 is also abraded to a thickness of 0.2 mm or less. Further, the upper polarizing plate 410 is glued on an upper side of the counter substrate 200 while a lower polarizing plate 420 is glued on a lower side of the glass substrate 10.

In Embodiment 4, the lower polarizing plate 420 extends up to the terminal section 150 of the glass substrate 10. Although the polarizing plate 420 needs to exist only in the display area, the glass substrate 10 of Embodiment 4 is abraded to have a small thickness and thus mechanically fragile. Therefore, for the purpose of reinforcing the glass substrate 10, the polarizing plate 420 is extended up to the terminal section 150. The glass substrate 10, the counter substrate 200, the lower polarizing plate 420, and the upper polarizing plate 410 constitute a liquid crystal display panel 2000.

As illustrated in FIG. 16, a backlight 3000 is disposed on the rear side of the liquid crystal display panel 2000 since the panel 2000 does not emit light by itself. The backlight 3000 includes a light-guiding plate, an optical sheet, and so on. When, especially, the light-guiding plate is reduced in thickness, the backlight 3000 can also be bent flexibly.

When the liquid crystal display device having the structure of FIG. 16 is bent, stress will be generated at the adhesion section F of FIG. 16 between the counter substrate 200 and the upper polarizing plate 410, which may result in displacement or detachment of the upper polarizing plate 410 and the counter substrate 200. The bending will also generate stress at the adhesion section G of FIG. 16 between the glass substrate 10 and the lower polarizing plate 420, which may cause displacement or detachment of the glass substrate 10 and the lower polarizing plate 420.

Figure 17:
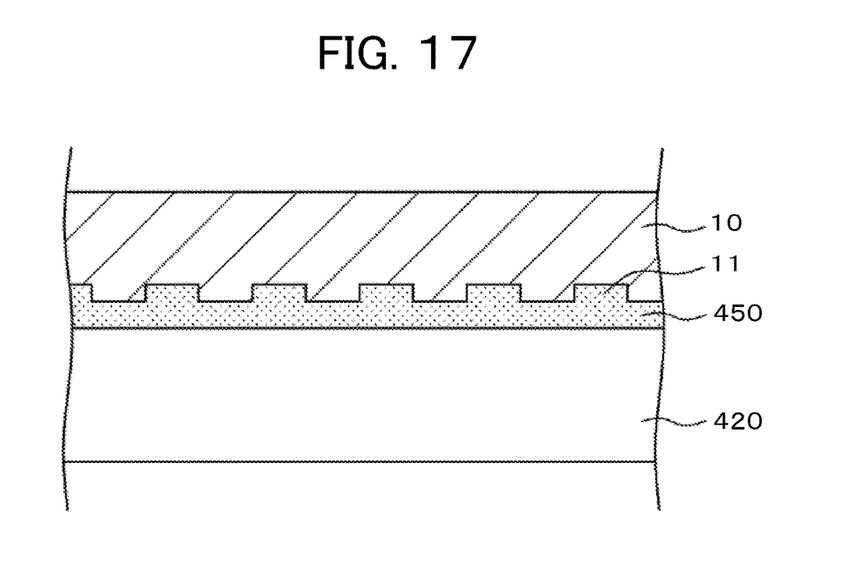
FIG. 17 is an enlarged view of section G of FIG. 16.

Therefore in Embodiment 4, to prevent such displacement or detachment, the section F shown in FIG. 16 is made to have the same structure as that of FIG. 14 related to Embodiment 2, and the section G shown in FIG. 16 is made to have the structure of FIG. 17. As illustrated in FIG. 17, the recessed portions 11 are formed on the glass substrate 10 at a side thereof facing the lower polarizing plate 420, and the recessed portions 11 are filled with the adhesive 30. The anchoring effect is thus being produced. The structure of FIG. 17 is substantially the same as that of FIG. 7 related to Embodiment 1. The anchoring effect obtained through the recessed portions 11, formed on the glass substrate 10 and the counter substrate 200, and through the adhesive 450 prevents displacement or detachment of the glass substrate 10 and the lower polarizing plate 420 as well as displacement or detachment of the counter substrate 200 and the upper polarizing plate 410.

FIG. 16 illustrates an example in which TFTs, video signal lines, and so forth are formed directly on the glass substrate 10. Alternatively, a polyimide substrate can be formed on the glass substrate 10, and TFTs, video signal lines, and so forth can be formed on the polyimide substrate. In such a case as well, the advantageous effects of Embodiment 4 can be obtained.

While we have stated that the recessed portions 11 are formed on both of the glass substrate 10 and the counter substrate 200, they can also be formed on either one of the substrates. In that case as well, the advantageous effects of the invention can be obtained.

It should be noted that if light passing through the glass substrate 10 or the counter substrate 200 is scattered, the image being produced may be less clear. Thus, the glass substrate 10 or the counter substrate 200 and the adhesive 450 need to have a similar refractive index.

Embodiment 5

Figure 18:
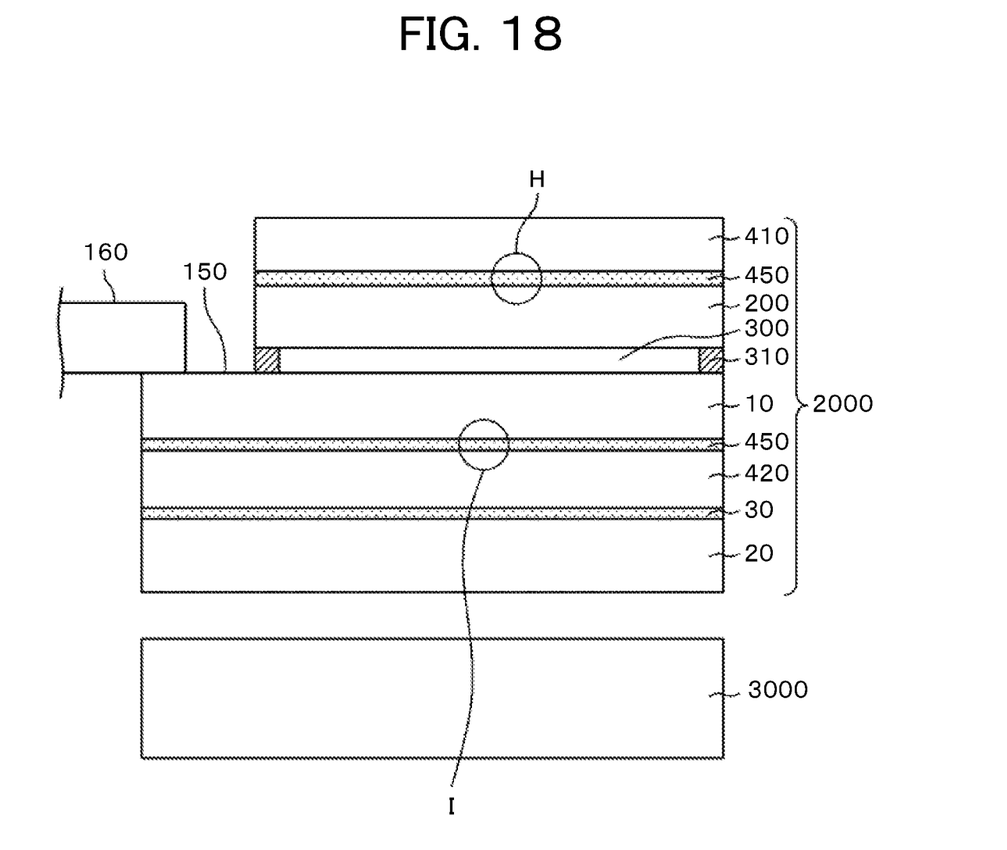
FIG. 18 is a cross section according to Embodiment 5 of the invention.

FIG. 18 is a cross section of a liquid crystal display device according to Embodiment 5 of the invention. FIG. 18 differs from FIG. 16 related to Embodiment 4 in that, in the former, the support substrate 20 is glued on a lower side of the lower polarizing plate 420. If the glass substrate 10 and the counter substrate 200 are each abraded to a thickness of, for example, 0.2 mm or less, the terminal section 150 where only the glass substrate 10 exists may not have sufficient rigidity.

To reinforce the terminal section 150 and thus the entire liquid crystal display panel, the support substrate 20 is glued on a lower side of the lower polarizing plate 420 as illustrated in FIG. 18. In this case, the support substrate 20 needs to be transparent to allow the light from the backlight to pass through the support substrate 20. Thus, the support substrate 20 is a transparent substrate formed of PET, acrylic resin, or the like. In FIG. 18, the backlight 3000 is disposed on the rear side of the liquid crystal display panel 2000, as is similar to Embodiment 4.

When the flexible display device having the structure of FIG. 18 is bent, stress will be generated at the adhesion section H of FIG. 18 between the counter substrate 200 and the upper polarizing plate 410, which may result in displacement or detachment of the upper polarizing plate 410 and the counter substrate 200. The bending will also generate stress at the adhesion section I of FIG. 18 between the glass substrate 10 and the lower polarizing plate 420, which may cause displacement or detachment of the glass substrate 10 and the lower polarizing plate 420. These phenomena are the same as in Embodiment 4.

Therefore in Embodiment 5, as same in Embodiment 4, the section H is made to have the same structure as that of FIG. 14, and the section I is made to have the same structure of that of FIG. 17. Thus, the anchoring effect obtained through the recessed portions 11, formed on the glass substrate 10 and the counter substrate 200, and through the adhesive 450 prevents displacement or detachment of the glass substrate 10 and the lower polarizing plate 420 as well as displacement or detachment of the counter substrate 200 and the upper polarizing plate 410.

FIG. 18 illustrates an example in which TFTs, video signal lines, and so forth are formed directly on the glass substrate 10. Alternatively, a polyimide substrate can be formed on the glass substrate 10, and TFTs, video signal lines, and so forth can be formed on the polyimide substrate. In such a case as well, the advantageous effects of Embodiment 5 can be obtained.

Further, while we have stated that the recessed portions 11 are formed on both of the glass substrate 10 and the counter substrate 200, they can also be formed on either one of the substrates. In that case as well, the advantageous effects of the invention can be obtained.

It should be noted that if light passing through the glass substrate 10 or the counter substrate 200 is scattered, the image being produced may be less clear. Thus, the glass substrate 10 or the counter substrate 200 and the adhesive 450 need to have a similar refractive index.

What is claimed is:

1. An organic EL display device comprising:
    a glass substrate;
    an organic EL layer formed on an upper side of the glass substrate;
    a support substrate glued on a lower side of the glass substrate via a first adhesive;
    a glass-made counter substrate covering the organic EL layer; and
    a polarizing plate glued on an upper side of the counter substrate via a second adhesive,
    wherein first recessed portions or first projecting portions are formed on the glass substrate at a side thereof facing the support substrate,
    wherein the first recessed portions or a space between each of the first projecting portions is filled with the first adhesive, and wherein second recessed portions or second projecting portions are formed on the counter substrate at a side thereof facing the polarizing plate.

2. The organic EL display device of claim 1, wherein the first recessed portions are formed at intervals, and wherein if a thickness of the glass substrate is assumed to be t and a depth of the first recessed portions is assumed to be h1, h1/t is determined such that $0.001 \leq h1/t \leq 0.1$.

3. The organic EL display device of claim 1, wherein the first projecting portions are formed at intervals, and wherein if a thickness of the glass substrate is assumed to be t and a height of the first projecting portions is assumed to be h2, h2/t is determined such that $0.001 \leq h2/t \leq 0.1$.

4. The organic EL display device of claim 1, wherein the second recessed portions are formed at intervals, and wherein if a thickness of the counter substrate is assumed to be t and a depth of the second recessed portions is assumed to be h1, h1/t is determined such that $0.001 \leq h1/t \leq 0.1$.

5. The organic EL display device of claim 1, wherein the second projecting portions are formed at intervals, and wherein if the thickness of the counter substrate is assumed to be t and a height of the second projecting portions is assumed to be h2, h2/t is determined such that $0.001 \leq h2/t \leq 0.1$.

6. The organic EL display device of claim 1, wherein the organic EL display device is bent, and wherein a density of the first recessed portions, the first projection portions, the second recessed portions, or the second projecting portions at the center of the bending is larger than in other regions.

7. An organic EL display device comprising:
a glass substrate;
a resin substrate formed on an upper side of the glass substrate;
an organic EL layer formed on an upper side of the resin substrate;
a support substrate glued on a lower side of the glass substrate via a first adhesive;
a glass-made counter substrate covering the organic EL layer; and
a polarizing plate glued on the counter substrate via a second adhesive,
wherein first recessed portions or first projecting portions are formed on the glass substrate at a side thereof facing the support substrate, and
wherein the first recessed portions are filled with the first adhesive, and
wherein second recessed portions or second projecting portions are formed on the counter substrate at a side thereof facing the polarizing plate.

8. The organic EL display device of claim 7, wherein the first recessed portions are formed at intervals, and wherein if a thickness of the glass substrate is assumed to be t and a depth of the first recessed portions is assumed to be h1, h1/t is determined such that $0.001 \leq h1/t \leq 0.1$.

9. The organic EL display device of claim 7, wherein the first projecting portions are formed at intervals, and wherein if a thickness of the glass substrate is assumed to be t and a height of the first projecting portions is assumed to be h2, h2/t is determined such that $0.001 \leq h2/t \leq 0.1$.

10. The organic EL display device of claim 7, wherein the second recessed portions are formed at intervals, and wherein if a thickness of the counter substrate is assumed to be t and a depth of the second recessed portions is assumed to be h1, h1/t is determined such that $0.001 \leq h1/t \leq 0.1$.

11. The organic EL display device of claim 7, wherein the second projecting portions are formed at intervals, and wherein if a thickness of the counter substrate is assumed to be t and a height of the second projecting portions is assumed to be h2, h2/t is determined such that $0.001 \leq h2/t \leq 0.1$.

12. The organic EL display device of claim 7, wherein the resin substrate is a polyimide substrate.

13. The organic EL display device of claim 7, wherein the organic EL display device is bent, and wherein a density of the first recessed portions, the first projection portions, the second recessed portions, or the second projecting portions at the center of the bending is larger than in other regions.

* * * * *